US006774044B2

United States Patent
Ke et al.

(10) Patent No.: US 6,774,044 B2
(45) Date of Patent: Aug. 10, 2004

(54) REDUCING PHOTORESIST SHRINKAGE VIA PLASMA TREATMENT

(75) Inventors: Chih-Ming Ke, Hsin-Chu (TW); Tsai-Sheng Giau, HsinChu (TW); Jaw-Jung Shin, Hsin Chu (TW); Anthony Yen, Austin, TX (US)

(73) Assignee: Taiwan Semiconductor Manufacturing Co., Ltd, Hsin Chu (TW)

( * ) Notice: Subject to any disclaimer, the term of this patent is extended or adjusted under 35 U.S.C. 154(b) by 24 days.

(21) Appl. No.: 10/047,266

(22) Filed: Jan. 14, 2002

(65) Prior Publication Data

US 2003/0132197 A1 Jul. 17, 2003

(51) Int. Cl.[7] .............................................. H01L 21/302
(52) U.S. Cl. ...................................... 438/706; 438/717
(58) Field of Search ................................ 438/706, 710, 438/725, 717; 216/47

(56) References Cited

U.S. PATENT DOCUMENTS

| | | | | |
|---|---|---|---|---|
| 5,804,088 A | * | 9/1998 | McKee | 216/47 |
| 5,976,769 A | * | 11/1999 | Chapman | 430/316 |
| 6,117,622 A | * | 9/2000 | Eisele et al. | 430/328 |
| 6,368,974 B1 | * | 4/2002 | Tsai et al. | 438/695 |
| 6,420,098 B1 | * | 7/2002 | Mautz | 430/313 |
| 6,433,878 B1 | * | 8/2002 | Niu et al. | 356/603 |
| 6,528,229 B2 | * | 3/2003 | Sato | 430/170 |

* cited by examiner

Primary Examiner—Kin-Chan Chen
(74) Attorney, Agent, or Firm—Tung & Associates

(57) ABSTRACT

Reducing photoresist shrinkage by plasma treatment is disclosed. A semiconductor wafer having one or more photoresist layers is plasma treated, such as plasma curing, plasma etching, and/or high-density plasma etching the wafer. After plasma treating, one or more critical dimensions on the photoresist layers is measured using an electron beam, such as by using a scanning electron microscope (SEM). The plasma treating of the wafer prior to measuring the critical dimensions using the electron beam decreases shrinkage of the photoresist layer when using the electron beam.

7 Claims, 3 Drawing Sheets

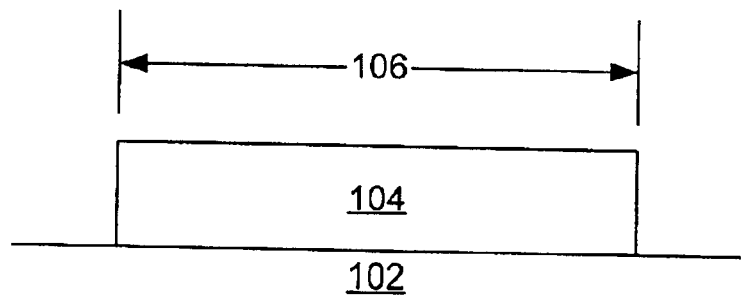
FIG 1A
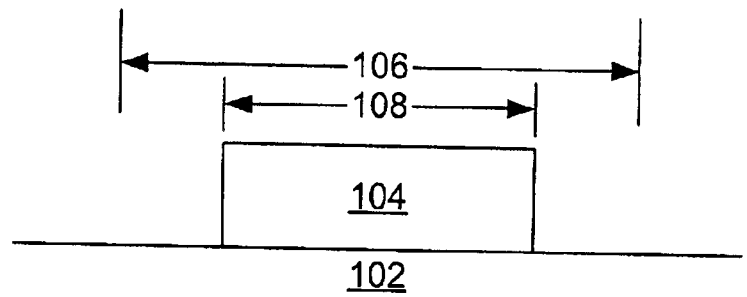
FIG 1B
FIG 1C
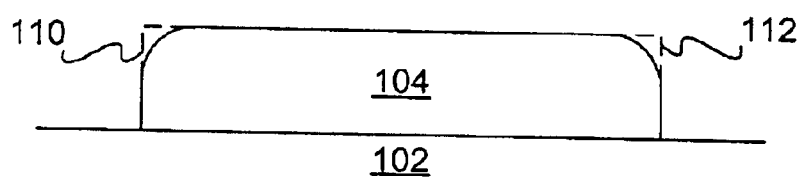

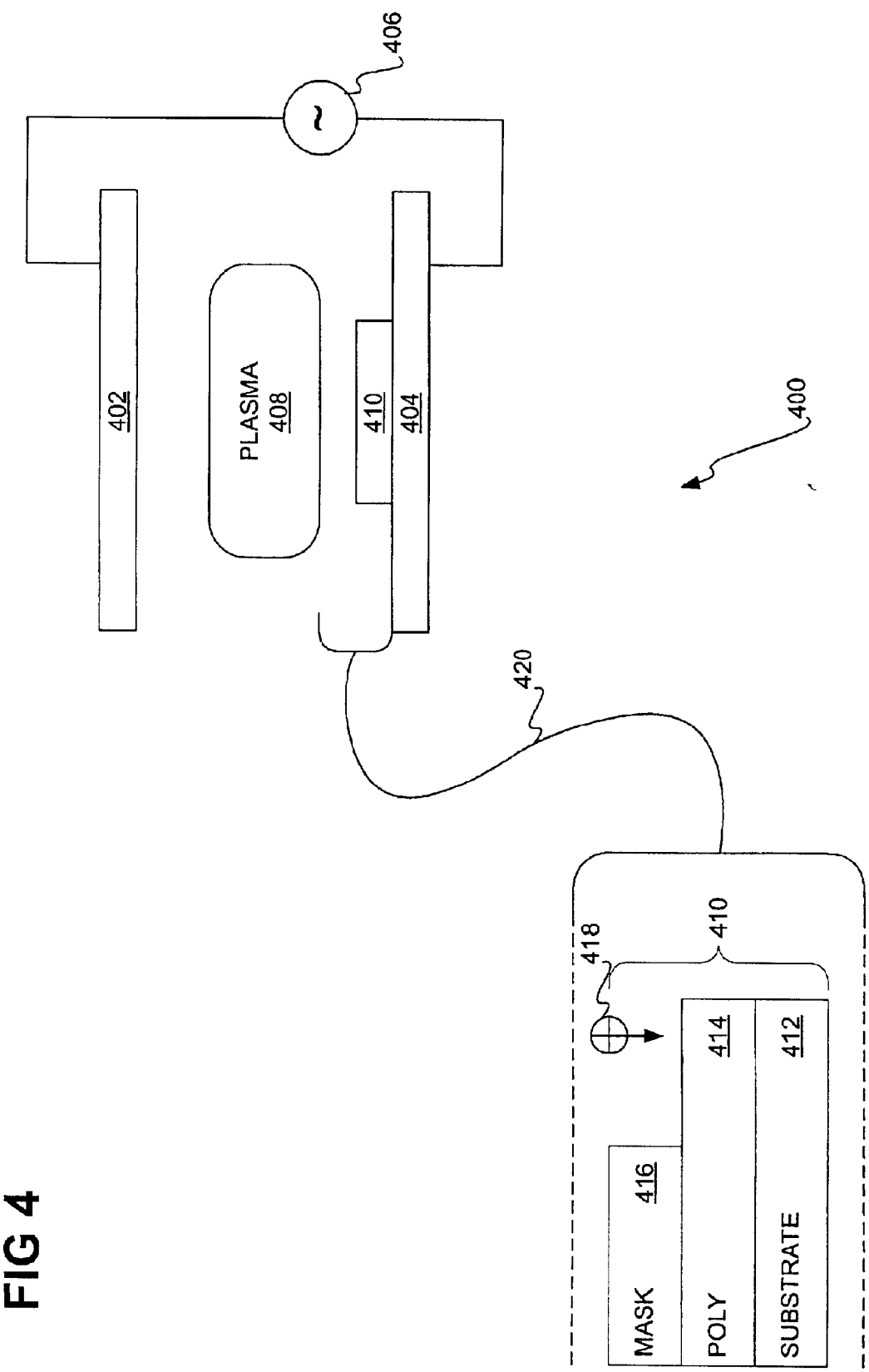

REDUCING PHOTORESIST SHRINKAGE VIA PLASMA TREATMENT

FIELD OF THE INVENTION

This invention relates generally to semiconductor device fabrication, and more particularly to photoresist shrinkage as may occur in photolithographic processing during such fabrication.

BACKGROUND OF THE INVENTION

Since the invention of the integrated circuit (IC), semiconductor chip features have become exponentially smaller and the number of transistors per device exponentially larger. Advanced IC's with hundreds of millions of transistors at feature sizes of 0.25 micron, 0.18 micron, and less are becoming routine. Improvement in overlay tolerances in photolithography, and the introduction of new light sources with progressively shorter wavelengths, have allowed optical steppers to significantly reduce the resolution limit for semiconductor fabrication far beyond one micron. To continue to make chip features smaller, and increase the transistor density of semiconductor devices, IC's have begun to be manufactured that have features smaller than the lithographic wavelength.

Sub-wavelength lithography, however, places large burdens on lithographic processes. Resolution of anything smaller than a wavelength is generally quite difficult. Pattern fidelity can deteriorate dramatically in sub-wavelength lithography. The resulting semiconductor features may deviate significantly in size and shape from the ideal pattern drawn by the circuit designer. Critical dimensions (CD's), which are the geometries and spacings used to monitor the pattern size and ensure that it is within the customer's specification, are especially important to have size maintenance during processing. CD bias refers to when the designed and actual values do not match. Ideally, bias approaches zero, but in actuality can measurably affect the resulting semiconductor device's performance and operation.

CD bias can result when the photoresist used during photolithographic processing shrinks, causing the CD values reflected in the photoresist to likewise shrink. A simple example is shown in FIGS. 1A and 1B. In FIG. 1A, the photoresist layer 104 on the semiconductor substrate 102 has a desired width 106, corresponding to a CD. After some photolithographic processing operations, however, the width of the layer 104 may shrink, as shown in FIG. 1B. The photoresist layer 104 in FIG. 1B has a width 108 that is reduced as compared to the desired width 106. Such CD bias is undesirable, and can cause performance and other errors in the resulting semiconductor device being fabricated.

Photoresist shrinkage is especially present in 193 nanometer (nm) lithography, which is also referred to as ArF lithography due to the type of laser used, an Argon Fluoride (ArF) laser. This is as compared to 248 nm lithography, which is referred to as KrF lithography due to its use of a Krypton Fluoride (KrF) laser. ArF laser lithography thus has a shorter wavelength—193 nm—as compared to KrF laser lithography, which has a 248 nm wavelength. It has been found that 193 nm photoresist lines shrink when exposed to an electron beam (e-beam) during CD measurements. This is significant, because CD measurements must periodically be taken to verify the CD's of the semiconductor device being fabricated. Such e-beam exposure usually occurs when using CD scanning electron microscopes (CD-SEM's) for CD measurement. Such CD measurement is referred to as CD-SEM measurement.

CD control is also a major challenge in sub-130 nm lithography technology. Advanced process control (APC) CD-bias feed-forward systems have been widely deployed for after-etch inspection (AEI) and after-development inspection (ADI) of CD's, as an automated manner by which CD's can be monitored and verified. However, ArF photoresist CD shrinkage caused by CD-SEM measurements distorts the CD bias, potentially leading to errors in the feed-forward system. That is, because CD-SEM measurements cause photoresist CD's to shrink, the APC CD-bias feed-forward systems can actually introduce errors into the semiconductor processing, by reducing the CD's that they are supposed to monitor and correct.

Unfortunately, whereas ArF resist shrinkage is a known phenomenon, its origins are not well understood. The magnitude of the shrinkage is material dependent. Acrylate-type resists shrink more than cycloolefin/maleic anyhride (COMA)-type resists. This may be due to polymer chain cleavage, which is observed on standard e-beam polymethyl methacrylate (PMMA) resists, or may be caused by polymer cross-linking, among other potential causes. For example, repeated measurements in an SEM may result in cross-linking, annealing, or hardening of the photoresist, causing it to shrink in volume. Different accelerating voltages or measurement doses may cause different levels of cross-linking on the resist surface, causing different shrinkage effects. At higher accelerating voltages or measurement frequencies, a greater volume of the photoresist may cross-link, causing greater resist shrinkage.

Therefore, as e-beam dosage increase with repeated CD-SEM measurements, more polymers within the photoresist undergo cross-linking, until all available polymers have done so. Shrinkage beings at the depth of e-beam penetration. Two mechanisms are believed to maintain progression of the shrinking. First, as repeated measurements continue, the increase e-beam dose induces more polymer cross-links within the e-beam penetration area, until all available polymers are depleted. Second, as the resist shrinks, the e-beam reaches a little deeper into the resist, inducing more resist shrinkage, until the cross-polymerized denser resist prevents further penetration.

Because APC CD-bias feed-forward systems can be a crucial component in ensuring proper CD bias, one approach to reducing photoresist shrinkage is to decrease the CD-SEM e-beam dosage when measuring the CD's. For example, a low voltage, such as 300 volts instead of 600 volts, may be used. Alternatively, a low beam current, low magnification, low image acquisition time, and/or off-site automatic SEM focusing can be used as way(s) to lower e-beam dosage. However, lowering the e-beam dosage typically only reduces photoresist shrinkage, and cannot guarantee elimination of resist shrinkage. Furthermore, it may also reduce image resolution, which is detrimental when measuring contact holes and other specific types of CD's.

Another existing approach to reducing photoresist shrinkage is to use e-beam curing prior to CD-SEM measurement. E-beam curing prior to CD-SEM measurement can eliminate shrinkage, but has some significant disadvantages. E-beam curing is the use of an e-beam to cure the photoresist, so that it subsequently will not shrink when CD-SEM measurements are taken. The cross-linking of the resist caused by e-beam curing, which prevents subsequent resist shrinkage, however, also affects the profile of the photoresist, especially in corner areas. This is disadvantageous because it means that the photoresist itself changes shape, which is problematic for later semiconductor fabrication processing that contemplates usage of a particular shape or profile of the resist. A simple example of this is shown in FIG. 1C. The resist layer 104 has its corners 110 and 112 rounded as compared to the layer 104 of FIG. 1, which is undesirable. E-beam curing may also potentially cause electron charge damage to the semiconductor device being fabricated.

Therefore, there is a need for reducing photoresist shrinkage that avoids these problems. Specifically, there is a need for reducing resist shrinkage that substantially eliminates shrinkage, and does not just reduce the shrinkage as lowering the e-beam dosage during CD-SEM measurement does. There is a need for reducing resist shrinkage that does not incur the side effects of e-beam curing, particularly the undesirable resist profile modification of e-beam curing. For these and other reasons, there is a need for the present invention.

SUMMARY OF THE INVENTION

The invention relates to using plasma curing to prevent photoresist shrinkage. A semiconductor wafer having one or more photoresist layers is plasma treated, such as plasma curing, plasma etching, and/or high-density plasma etching the wafer. After plasma treating, one or more critical dimensions on the photoresist layers is measured using an electron beam, such as by using a scanning electron microscope (SEM). The plasma treating of the wafer prior to measuring the critical dimensions using the electron beam decreases shrinkage of the photoresist layer when using the electron beam.

Embodiments of the invention provide for advantages over the prior art. Plasma treatment substantially eliminates photoresist shrinkage, as opposed to mere reduction as lowering the e-beam dosage during critical dimension SEM measurement does. Plasma treatment also avoids the side effects that results from electron beam curing, especially the undesirable resist profile modification that results from electron beam curing. Still other advantages, aspects, and embodiments of the invention will become apparent by reading the detailed description that follows, and by referring to the accompanying drawings.

BRIEF DESCRIPTION OF THE DRAWINGS

FIGS. 1A, 1B, and 1C are diagrams showing an example photoresist that undergoes shrinkage from its desired profile in FIG. 1A to an undesired profile in FIG. 1B as a result of critical dimension measurement using an electron beam, and undergoes profile modification from its desired profile in FIG. 1A to an undesired profile in FIG. 1C as a result of electron beam curing.

FIG. 4 is a diagram of a plasma treatment system according to an embodiment of the invention, in which ion dosage is increased in a semiconductor wafer to increase the wafer's resistant to photoresist shrinkage during critical dimension measurement using an electron beam.

DETAILED DESCRIPTION OF THE INVENTION

In the following detailed description of exemplary embodiments of the invention, reference is made to the accompanying drawings that form a part hereof, and in which is shown by way of illustration specific exemplary embodiments in which the invention may be practiced. These embodiments are described in sufficient detail to enable those skilled in the art to practice the invention. Other embodiments may be utilized, and logical, mechanical, and other changes may be made without departing from the spirit or scope of the present invention. The following detailed description is, therefore, not to be taken in a limiting sense, and the scope of the present invention is defined only by the appended claims.

The invention employs plasma treatment to cure photoresist prior to critical dimensions (CD's) being measured by using an electron beam (e-beam). The plasma treatment may be a plasma etching, a high-density plasma etching, a plasma curing, and/or another type of plasma process. The plasma treatment may increase the ion dosage in the photoresist, increasing the resistance of the resist to shrinkage during subsequent e-beam measurement. For example, the ion dosage may be increased by using a high-density plasma etcher having an ion density of about $10^{12}$ cm$^{-3}$ to plasma cure the photoresist, increasing the resist shrinkage resistance. The e-beam measurement may be after-development inspection (ADI) or after-etching inspection (AEI). The e-beam measurement may also be CD scanning electron microscope (CD-SEM) measurement. The photoresist may be Argon Fluoride (ArF) 193-nanometer resist, Fluoride ($F_2$) 157-nanometer resist, or another type of photoresist.

Figure 2:
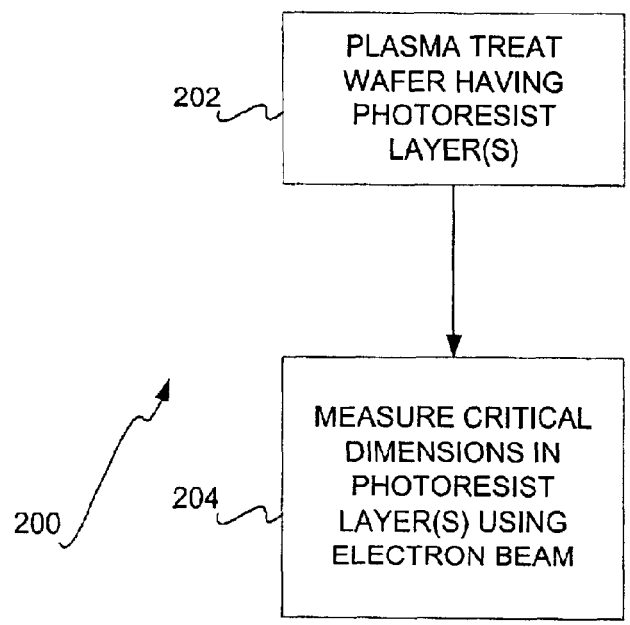
FIG. 2 is a flowchart showing a method according to an embodiment of the invention in which plasma treatment is performed prior to critical dimension measurement via an electron beam, to reduce photoresist shrinkage that results when using the electron beam.

FIG. 2 shows a method 200 that diagrammatically illustrates this approach. A semiconductor device may also be fabricated at least in part by performing the method 200. First, the semiconductor wafer with one or more photoresist layers is plasma treated (202). The resist layers have one or more critical dimensions that need to be measured, such that they are measured using an e-beam (204). Preferably, the plasma treatment substantially prevents shrinkage of the photoresist layers when measuring the critical dimensions using the electron beam. Alternatively, the plasma treatment substantially reduces shrinkage of the resist layers when using the electron beam. However, at the very least, the plasma treatment decreases shrinkage of the resist layers when using the electron beam.

The usage of plasma treatment in this manner has been confirmed to reduce resist shrinkage. For example, ten and fifty repeated measurements were performed in one experiment, at 300 and 600 accelerating voltages, on differing films. These films include Acrylate-type ArF resist over inorganic anti-reflective coating (ARC), over polysilicon. An $O_2/Cl_2$ chemistry was used in the plasma treatment, and both ten- and sixty-inch plasma treatments were conducted to confirm the plasma-curing capability. This experiment confirmed the reduction in resist shrinkage by using plasma treatment.

Figure 3:
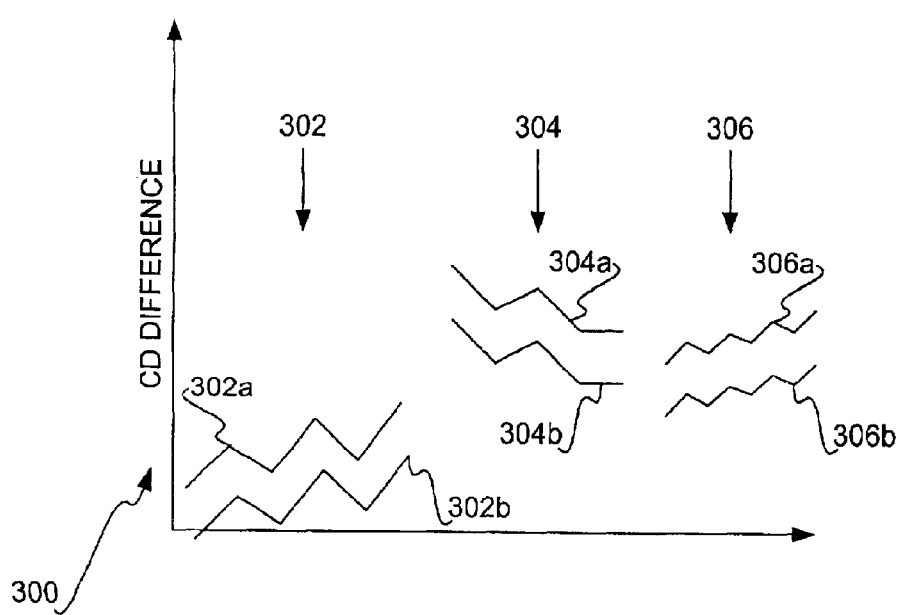
FIG. 3 is a diagram showing a representational graph illustratively depicting the reduction in photoresist shrinkage that results from using plasma treatment according to the invention.

FIG. 3 shows a graphical representation of the resist shrinkage reduction that results from using plasma treatment. The graph 300 includes three separate parts 302, 304, and 306. The first part 302 includes the CD difference line 302a and the CD difference line 302b. The line 302a represents the CD difference resulting from e-beam CD measurement where plasma treatment has not occurred, whereas the line 302b represents the CD difference resulting from e-beam CD measurement where plasma treatment has occurred. The line 302b being lower than the line 302a indicates that plasma treatment reduces photoresist shrinkage after e-beam CD measurement.

The second part 304 includes the CD difference line 302a and the CD difference line 302b, and is indicative of the CD differences after a number of e-beam measurements have occurred relative to the first part 302. The line 304a represents the CD difference resulting from e-beam CD measurement where plasma treatment has not occurred, whereas the line 304b represents the CD difference resulting from e-beam CD measurement where plasma treatment has occurred. The line 304b being lower than the line 304a again indicates that plasma treatment reduces photoresist shrinkage after e-beam CD measurement.

The third part 306 includes the CD difference line 306a and the CD difference line 306b, and is indicative of the CD differences when increasing the e-beam voltage relative to the second part 304, such as from 300 volts to 600 volts. The line 306a represents the CD difference resulting from e-beam CD measurement where plasma treatment has not occurred, whereas the line 306b represents the CD difference resulting from e-beam CD measurement where plasma treatment has occurred. The line 306b being lower than the line 306a indicates that plasma treatment reduces photoresist shrinkage after e-beam CD measurement.

FIG. 4 shows diagrammatically a plasma treatment system 400 according to an embodiment of the invention. The system 400 includes plates 402 and 404, between which a potential is applied via a power supply 406. This excites the plasma 408 between the plates 402 and 404, causing an ion dosage to etch away the wafer 410. The line 420 shows the increased ion dosage against the wafer 410 in more detail. The wafer 410 includes a substrate 412, a polysilicon layer 414, and a mask 416. The ion dosage resulting from the excited plasma 408, represented as the single ion 418 for illustrative purposes, increases the ion dosage of the wafer 410, increasing the resistance of the wafer 410 to photoresist shrinkage.

It is believed that plasma curing etches away the photoresist, but leaves a new resist surface in a state similar to that of prolonged e-beam exposure. Additionally, the plasma etching process is sensitive to the initial surface condition of the resist, such that the etching rate changes depending on prior e-beam exposure. Plasma curing and resist shrinkage due to e-beam exposure complement each other. For example, the plasma etch may also cross-link the photoresist, but the rate of the plasma etch on fresh resist may be much higher than that for cross-linked resist.

Thus, the resist-hardening process by plasma treatment is similar to e-beam curing, but is more effective and efficient than e-beam curing. High-density plasma etching is anistropic, which ensures that the resist surface receives uniform ion dosage on all sides, so that the features are etched evenly in the process. Resist feature distortion from plasma treatment is significantly less than that from less anistropic processes, such as e-beam etching. The common operating pressure of high-density plasma etchers is about one to ten mTorr, and the mean free path at one mTorr is about 48 millimeters. This long free path advantageously provides for better CD control.

It is noted that, although specific embodiments have been illustrated and described herein, it will be appreciated by those of ordinary skill in the art that any arrangement is calculated to achieve the same purpose may be substituted for the specific embodiments shown. This application is intended to cover any adaptations or variations of the present invention. Therefore, it is manifestly intended that this invention be limited only by the claims and equivalents thereof.

What is claimed is:

1. A method comprising:
   plasma curing a semiconductor wafer having at least one photorsist layer; and,
   after plasma curing the semiconductor wafer, measuring one or more critical dimensions on the at least one photorsist layer using an electron beam,
   such that plasma curing the semiconductor wafer prior to measuring the one or more critical dimensions using the electron beam substantially reducing shrinkage of the at least one photoresist layer when using the electron beam.

2. The method of claim 1, wherein plasma curing the at least one photoresist layer increases ion dosage of the at least one photoresist layer.

3. The method of claim 1, wherein measuring the one or more critical dimensions using the electron beam comprises critical dimension scanning electron microscope measurement of the one or more critical dimensions.

4. The method of claim 1, wherein measuring the one or more critical dimensions using the electron beam comprises after-development inspection of the one or more critical dimensions.

5. The method of claim 1, wherein measuring the one or more critical dimensions using the electron beam comprises after-etching inspection of the one or more critical dimensions.

6. The method or claim 1, wherein plasma curing the semiconductor wafer increases ion dosage of the at least one photoresist layer, increasing resistance of the at least one photoresist layer to shrinkage when using the electron beam.

7. The method of claim 1, wherein measuring the one or more critical dimensions using the electron beam comprises one of; critical dimension scanning electron microscope measurement of the one or more critical dimensions; after-development inspection of the one or more critical dimensions; and, after-etching inspection of the one or more critical dimensions.

* * * * *